United States Patent [19]

Jones et al.

[11] Patent Number: 4,667,144

[45] Date of Patent: May 19, 1987

[54] HIGH FREQUENCY, HIGH VOLTAGE MOSFET ISOLATION AMPLIFIER

[75] Inventors: Franklin B. Jones, Baltimore; Walter E. Milberger, Severna Park, both of Md.

[73] Assignee: The United States of America as represented by the Secretary of the Air Force, Washington, D.C.

[21] Appl. No.: 870,045

[22] Filed: Jun. 3, 1986

[51] Int. Cl.$^4$ .............................................. G05F 1/46
[52] U.S. Cl. .............................. 323/271; 330/207 A; 307/270
[58] Field of Search ............... 363/16; 323/271, 272, 323/274; 307/270, 571; 330/207 A, 251

[56] References Cited

U.S. PATENT DOCUMENTS

| | | | |
|---|---|---|---|
| 4,342,967 | 8/1982 | Regan et al. | 330/277 |
| 4,441,068 | 4/1984 | Smith | 323/351 |
| 4,443,719 | 4/1984 | Planer et al. | 307/570 |
| 4,455,526 | 6/1984 | Miller | 323/282 |
| 4,461,966 | 7/1984 | Hebenstreit | 307/571 |
| 4,540,893 | 9/1985 | Bloomer | 307/248 |
| 4,565,931 | 1/1986 | Fumey | 307/270 |
| 4,608,541 | 8/1986 | Moriwaki et al. | 330/207 A |

FOREIGN PATENT DOCUMENTS

| | | | |
|---|---|---|---|
| 809516 | 2/1981 | U.S.S.R. | 307/270 |
| 1170584 | 7/1985 | U.S.S.R. | 330/251 |

Primary Examiner—Peter S. Wong
Assistant Examiner—Judson H. Jones
Attorney, Agent, or Firm—William Stepanishen; Donald J. Singer

[57] ABSTRACT

A MOSFET isolation amplifier apparatus to allow stable high frequency linear operation of MOSFET power stages and to provide precise regulation of a load current through a magnetic yoke load. Variations of transfer characteristics and input parameters in the MOSFET power stages are corrected by use of a feedback signal which is generated in a current sense resistor by the load current. Such a power stage allows the implementation of isolation amplifiers which can provide high power high frequency linear regulation at elevated voltages and currents.

6 Claims, 17 Drawing Figures

POWER MOSFET CAPACITANCES

AMPLIFIER RESPONSE

PARALLEL OPERATION

SERIES OPERATION

HIGH FREQUENCY, HIGH VOLTAGE MOSFET ISOLATION AMPLIFIER

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an isolation amplifier apparatus, and in particular to the linear operation of power MOSFETs in a high voltage isolation amplifier apparatus.

Power MOSFETs are well suited for applications as high voltage amplifiers because of their ability to handle high peak power loads that are subjected only to average power limits, and also for their immunity to the second avalanche condition which is due high voltage transients. The linear operation of MOSFETs requires that the drive unit have a low impedance in order to control the gate voltage, because the input capacitance varies directly with the drain-source voltage.

The state of the art of isolated amplifiers and circuits is well represented and alleviated to some degree by the prior art apparatus and approaches which are contained in the following U.S. Patents:

U.S. Pat. No. 4,342,967 issued to Regan et al on Aug. 3, 1984;
U.S. Pat. No. 4,441,068, issued to Smith on Apr. 3, 1984;
U.S. Pat. No. 4,443,719 issued to Planar et al on Apr. 17, 1984;
U.S. Pat. No. 4,455,526 issued to Miller on June 19, 1984;
U.S. Pat. No. 4,461,966 issued to Hebenstreit July 24, 1984;
U.S. Pat. No. 4,540,893 issued to Bloomer on Sept. 10, 1985.

The Smith reference discloses a circuit for driving an electrical motor which includes a linear transconductance amplifier 32 having an operational amplifier 68. The patented transconductance amplifier is provided with current sensing feedback.

The Hebenstreit reference in FIG. 5 shows a circuit for controlling a pair of power FETs 12 and 34 by way of a transformer 7 and transistor switches 10. The load is shown at 13 in this patent.

The Bloomer reference is concerned with a circuit for controlling a power FET with either load voltage or load current feedback.

The Planar et al reference discusses voltage isolation using a pulsed transformer. A high voltage, high frequency amplifier using FETs is taught in the Regan et al patent.

The Miller reference discloses high voltage, high power FET operation with transformer coupling and pulse width modulator in the control circuit. However, none of the references provide the overall combination of power FETs in conjunction with an isolation transconductance amplifier and a floating operational amplifier drive. The present invention is intended to satisfy that need.

SUMMARY OF THE INVENTION

The present invention utilizes a high voltage isolation amplifier as the drive means for the inductor of a programmable microwave attenuator. A pair of power MOSFET devices are used to control the current flow through a magnetic yoke. The power MOFSET devices cooperate with floating operational amplifier drive circuits to act as a transconductance amplifiers, and pass a load current according to command. The current command is rectified in a transformer-coupled modulator unit that receives a 10 Mhz modulated carrier signal. The carrier modulation is accomplished by a ground deck circuit which compares the load current to the current command that is received. The high frequency response is achieved by closing an inner loop around the MOSFET and its drive, with an outer loop around the entire isolation amplifier.

It is one object of the present invention, therefore, to provide an improved high frequency, high voltage MOSFET isolation amplifier apparatus.

It is another object of the invention to provide an improved MOSFET isolation amplifier apparatus having improved high frequency response, linearity, power supply ripple rejection, carrier rejection, and gain-phase characteristics.

It is another object of the invention to provide an improved MOSFET isolation amplifier apparatus that uses floating high performance operational amplifiers to provide low impedance gate drive to allow high frequency operation of power MOSFET devices.

It is another object of the invention to provide an improved MOSFET isolation amplifier apparatus that uses operational amplifiers to function as a buffer with constant impedance carrier coupling, allowing improved rejection of the carrier frequency.

It is another object of the invention to provide an improved MOSFET isolation amplifier apparatus that uses an inner feedback loop to correct for threshold voltage variations from device to device and over temperature.

It is another object of the invention to provide an improved MOSFET isolation amplifier apparatus that uses an inner feedback loop to correct variations in transfer characteristics from device to device and over temperature.

It is a further object of the invention to provide an improved MOSFET isolation amplifier apparatus that uses an inner feedback loop to provide a floating power stage and well behaved transfer characteristics.

It is another object of the invention to provide an improved MOSFET isolation amplifier apparatus that uses an inner feedback loop to provide high frequency power supply ripple rejection.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
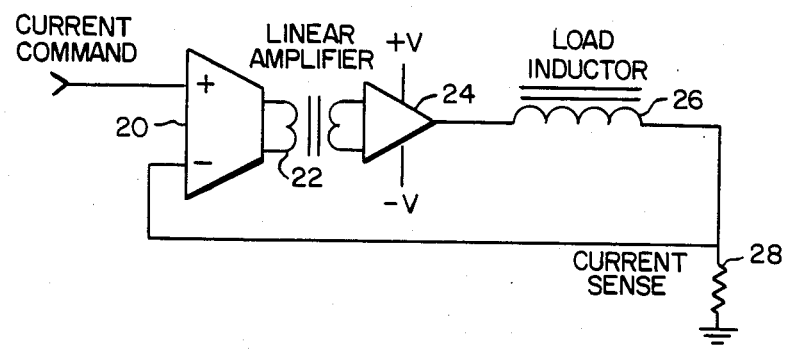
FIG. 1 is a simplified schematic diagram of a current control apparatus for a programmable microwave attenuator.

A programmable microwave attenuator for use in a microwave system will require an electronic drive unit that is capable of providing precise control of currents through large electromagnets. There is shown in FIG. 1, a simplified schematic diagram of an electronic current control unit that will provide a precisely controlled current waveform to the load inductor of a programmable microwave attenuator. An analog current command is received by a current control unit 20 and is applied through transformer unit 22 to an operational amplifier unit 24. The operational amplifier unit 24 which is floating with respect to the system or circuit ground drives a current through the load inductor unit 26. The current which is applied to the load inductor unit 26, also passe through a sense resistor to generate a feedback voltage. This feedback signal is applied to the inverting input (−) of the current control unit 20 to generate the current signal that is applied by the linear amplifier unit to the load inductor unit 26. The linear amplifier unit comprises the current control unit 20, the transformer unit 22 and the operational amplifier unit 24.

The linear amplifier unit in this circuit must control a current of plus and minus 7 amperes with voltages of plus and minus 300 volts, and must precisely following signal waveforms at frequencies in excess of 10 Hz. One element that may be utilized to build such a linear amplifier unit is described in U.S. Pat. No. 4,507,129, entitled "High Power High Voltage Linear Amplifier Apparatus", Walter E. Milberger, inventor. This amplifier apparatus used a small signal bipolar transistor to bias the power MOSFET to its threshold voltage, so that a small quiescent current was carried. A transformer coupled command signal was superimposed on this bias voltage for linear operation. The present invention utilizes the linear operation of the cited linear amplifier apparatus to provide a MOSFET isolation amplifier that allows the direct implementation of such functions as active linear high voltage regulation, capacitor droop compensation, and pulse shaping modulators.

Figure 2:
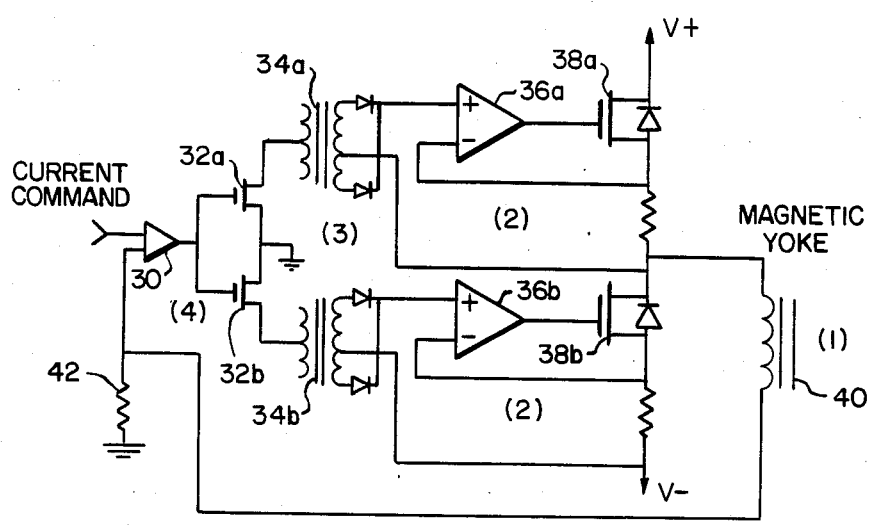
FIG. 2 is a simplified schematic diagram of the MOSFET isolation amplifier apparatus according to the present invention.

A simplified schematic of the MOSFET isolation amplifier is shown in FIG. 2. The circuit that is shown in FIG. 2 is basically the same circuit as in FIG. 1 with the addition of a pair of power MOSFET devices. The power MOSFET devices are connected in series between two high voltage sources, V+ and V−. The linear isolation amplifier comprises an input amplifier 30 that receives the current command signal at the non-inverting input. The output signal from the input amplifier 30 is respectively applied through FET units 32a, 32b to the primary windings of transformer units 34a, 34b. The output signal from the secondary windings of transformer units 34a, 34b are respectively applied to the non-inverting input of operational amplifier units 36a, 36b. The output signal from the operational amplifier units 36a, 36b is respectively applied to the input of power MOSFET devices 38a, 38b. The load source which is powered by the MOSFET devices 38a, 38b in response to the current command is the magnetic yoke unit 40. The current signal which is applied through the magnetic yoke unit 40 also passes through feedback resistor 42 to develop a voltage feedback signal that is applied to the inverting input of input amplifier unit 30.

The magnetic yoke unit 40 is the load source through which the current signal must be controlled. The power MOSFET units 38a, 38b which operate the floating operational amplifier drive circuits 36a, 36b act as a transconductance amplifiers to pass the current signal in response to the circuit command signal. This current command signal is rectified in a transformer-coupled modulator that utilizes a 10 MHz modulated carrier signal which is applied to the primary windings of transformer units 34a, 34b. The carrier modulation is accomplished by the ground deck circuit (input amplifier unit 30, FET devices 34a, 34b and transformer units 34a, 34b) which compares the load current to the current command signal that is received by the input amplifier 30.

Figure 3:
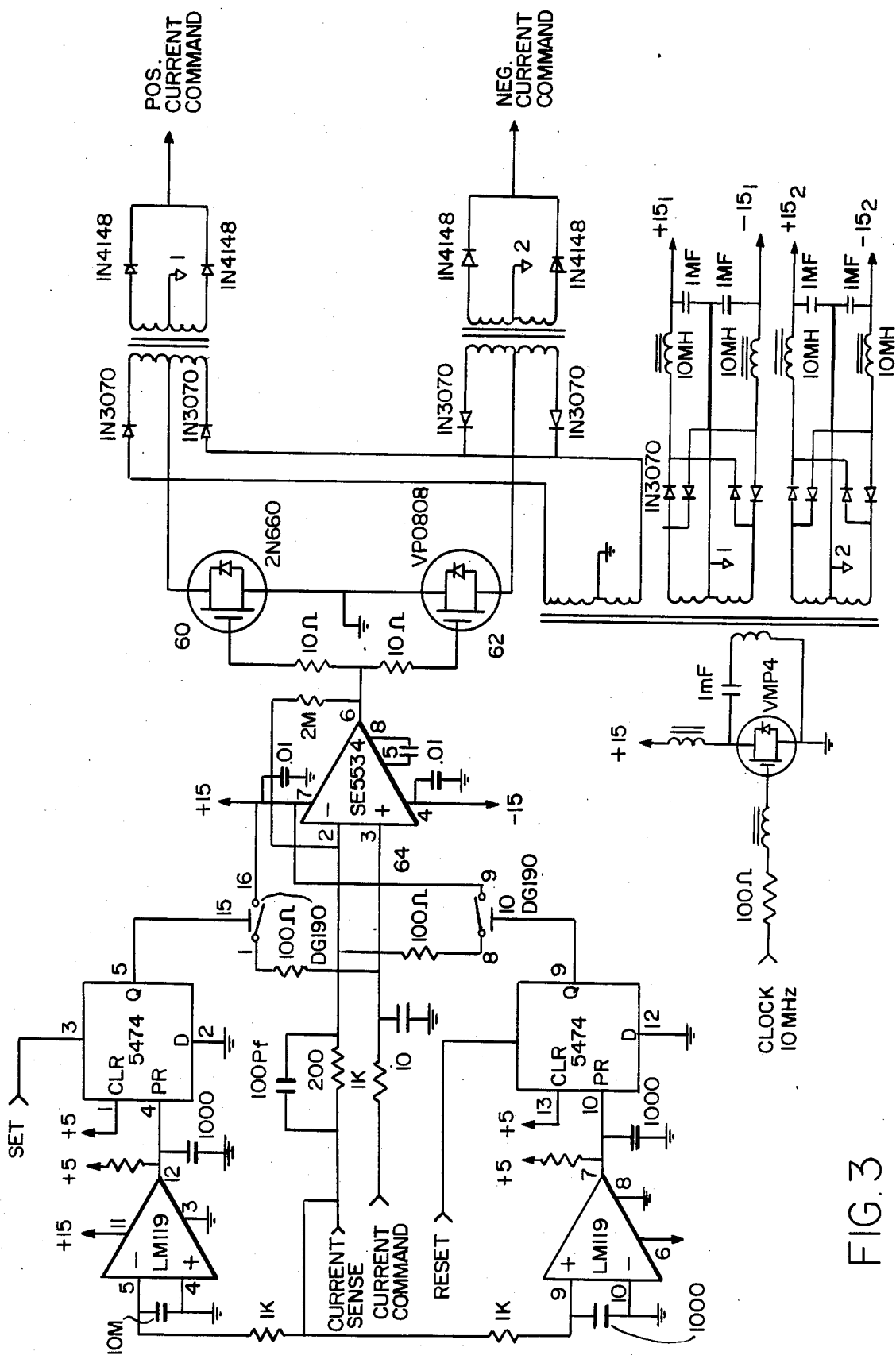
FIG. 3 is a detailed schematic diagram of the ground deck and isolation stages of the isolation amplifier apparatus.
Figure 4:
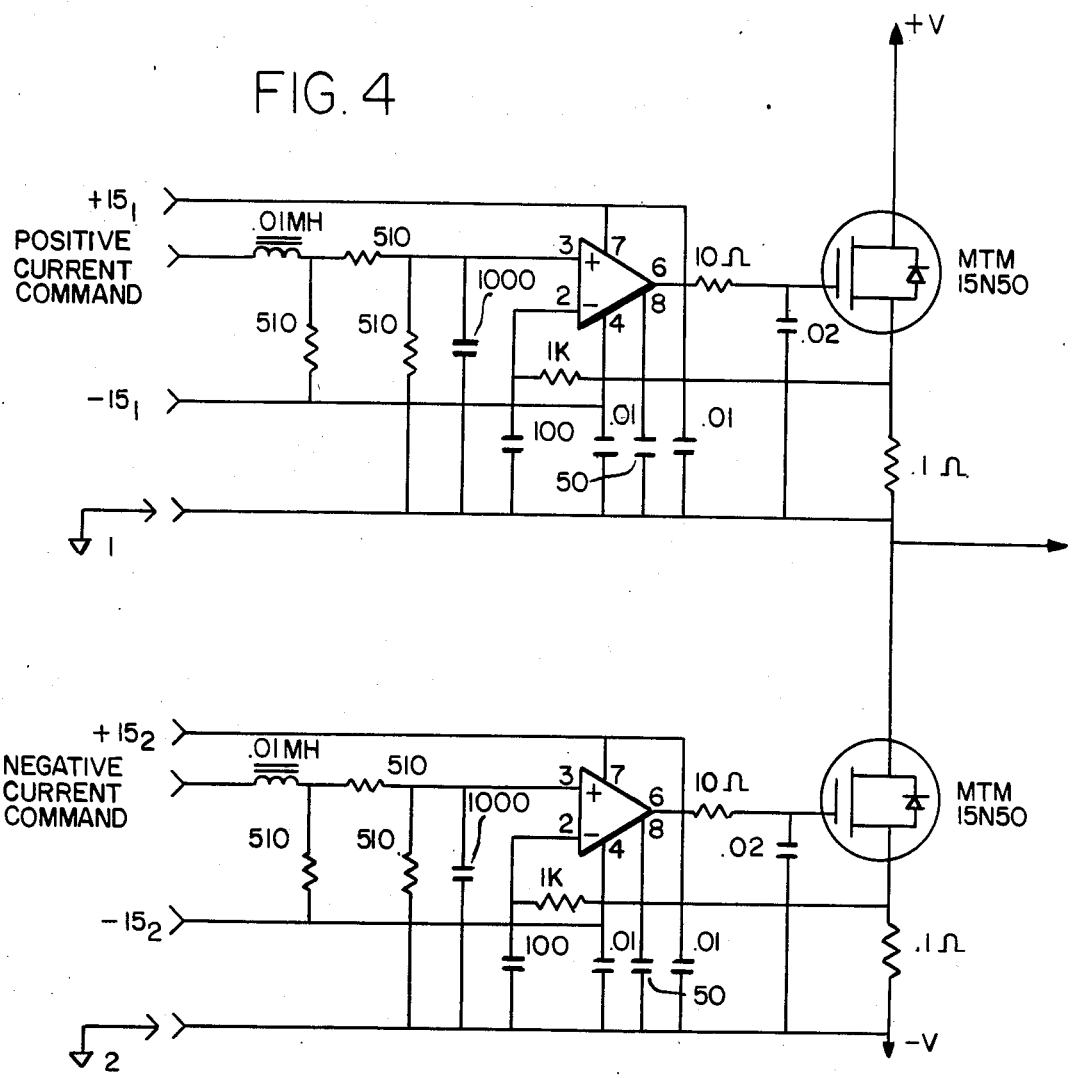
FIG. 4 is a detailed schematic diagram of the power stage of the present invention.

A detailed schematic of the ground deck and coupling circuits is given in FIG. 3. The power stage is shown in FIG. 4. FIGS. 3 and 4 will be discussed in greater detail in the descriptions of the preferred embodiments that follow.

The MOSFET isolation amplifier is configured to provide precise regulation of a load current according to a dynamic command. Sufficient bandwidth is needed not only to track the current command, a function which repeats a 100 Hz, with high accuracy; but also to correct for power supply ripple and regulation.

The bandwidth of any loop which can be closed around the entire isolation amplifier is limited by the isolation carrier frequency of 10 MHz. This frequency is sufficient to track the current command signal, but is not high enough to allow active power supply filtering.

Furthermore, a number of complications arise when using power MOSFETs for linear operation. These result primarily from two sources; the variations of transfer characteristics and of internal capacitances.

Figure 5A:
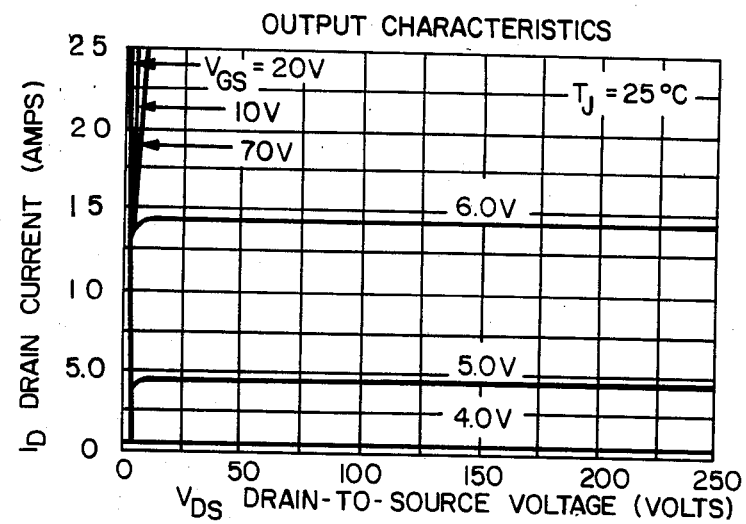
FIGS. 5A–5F are graphical representations of typical operating characteristics of a power MOSFET device.
Figure 5C:
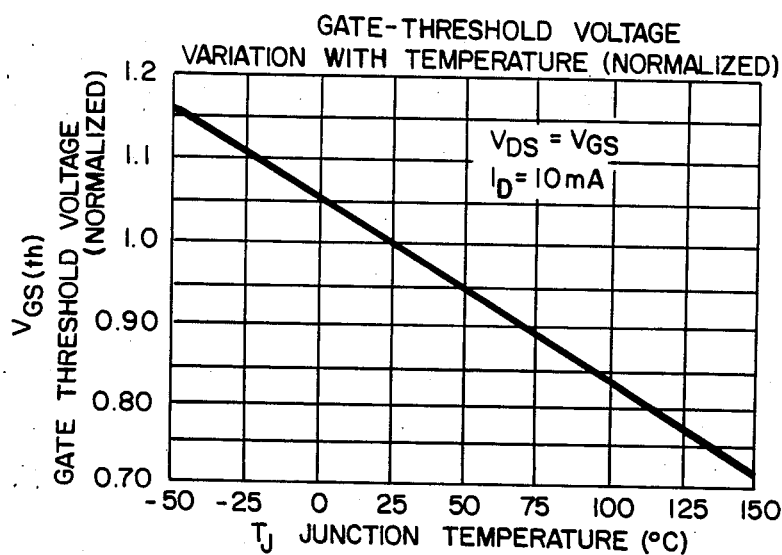
Figure 5E:
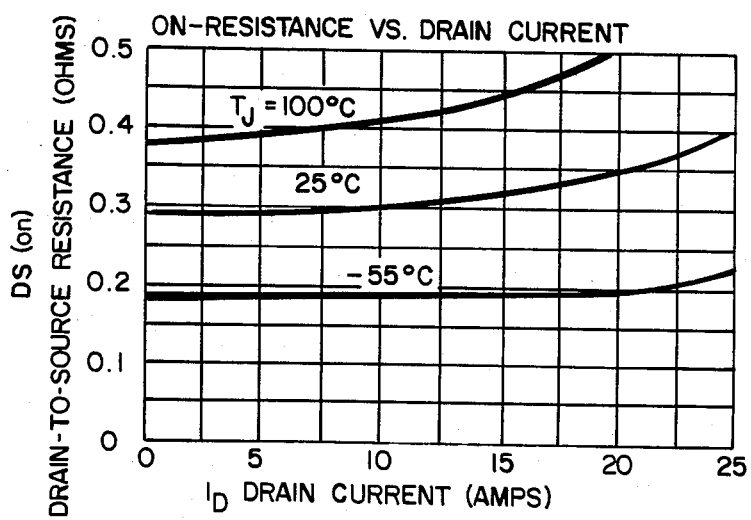
Figure 5B:
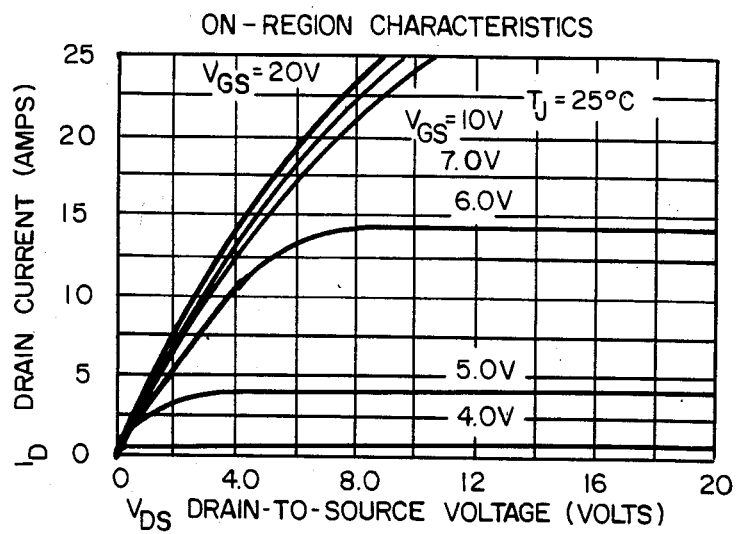
Figure 5D:
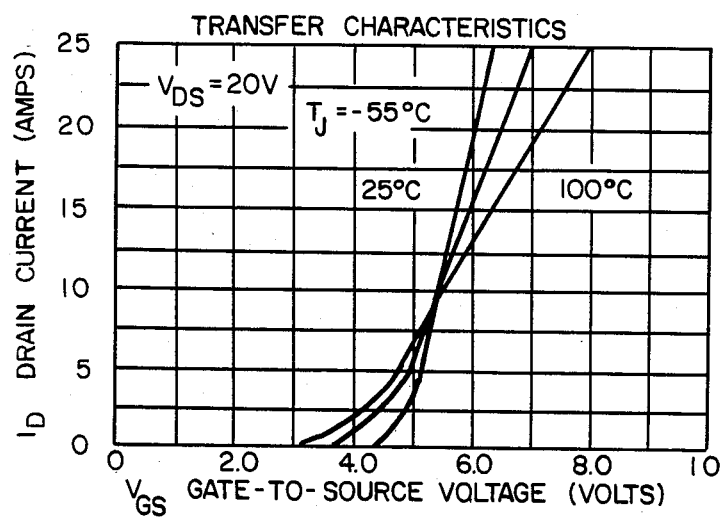

The transfer characteristics which include the gate threshold voltage, vary with temperature change and also vary from device to device. Typical examples of these transfer characteristics are shown in FIGS. 5C and 5D. These variations will be relatively slow, and may be corrected by an outer loop with some loss of bandwidth.

Figure 5F:
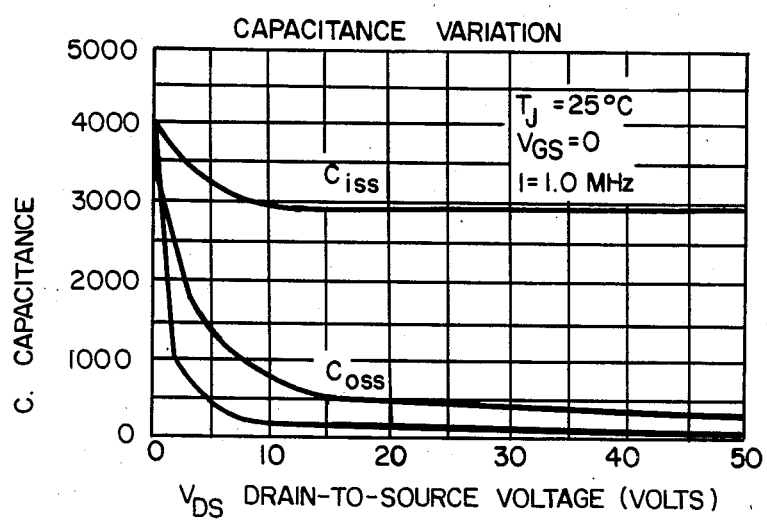
Figure 6:
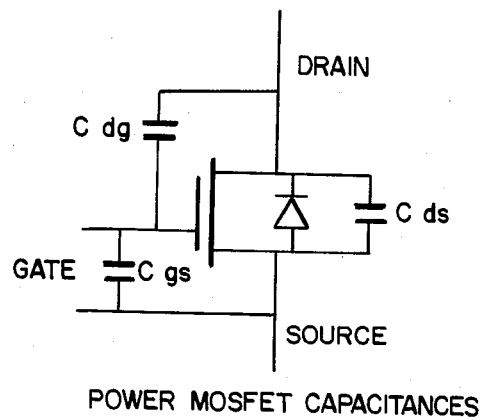
FIG. 6 is a schematic diagram of the equivalent circuit of a power MOSFET device.

The problems that are caused by the internal capacitances which are associated with power MOSFET devices, are less easily dealt with. There is shown in FIG. 6 an example of the internal capacitances that occur in power MOSFET devices. The most obvious effect is the R-C corner set by the gate capacitance and the drive impedance, which limits the maximum amplifier bandwidth. This R-C corner is not fixed, and as maybe seen in FIG. 5F, the input capacitance varies with the drain-source voltage. In order achieve a fast response, it is important that the gate drive impedance be low.

When the power MOSFET is operating in its linear region it is a current restricting device. The characteristic is shown in FIGS. 5A and 5B. It may be seen that for any given gate-source voltage, a set current is passed through the device, regardless of drain-source voltage. This operating characteristic inherently provides a degree of power supply ripple rejection. However, the ripple that is due to the power supply is not completely rejected, because the drain-source voltage is coupled to the gate through the reverse transfer capacitance, Cdg. When the drain-source voltage changes, the drain-gate voltage will change, also, and as a result thereof, charge is coupled to the gate through the reverse transfer capacitance Cgs. Additionally, the chain of events continues since the gate-source capacitance Cgs charges up, and the drain-source current will change accordingly. Thus, the gate voltage must be maintained by a very low impedance voltage source in order to provide ripple rejection.

The problem of maintaining a constant gate-source voltage arises in a different manner with low drain-source voltages. In FIG. 5F it may be clearly seen that the internal capacitances change dramatically as the drain to source voltage $V_{DS}$ changes. If the charge on the gate capacitance is not adjusted accordingly, the gate voltage, and conseqently the drain-source current will change.

In all these situations, the preferred solution to prevent the occurrence of these events is to provide very low drive impedance at all frequencies. The very low drive impedance that is needed by the MOSFET devices can not be provided through the isolation transformers from the ground deck, due to the impedance of the carrier circuit. This problem is overcome by the use of a floating operational amplifier and an inner loop in the gate circuit as shown in FIG. 4.

A current command is received, rectified, and filtered from the modulated carrier signal. Power voltages are taken from the unmodulated carrier, and stored in 1 microfarad capacitors. The operational amplifiers 50 respectively drive the MOSFET 52a, 52b gates to that the devices pass a current that drops a voltage across the 0.1 Ohm sense resistor which is equal to the command voltage.

Figure 7:
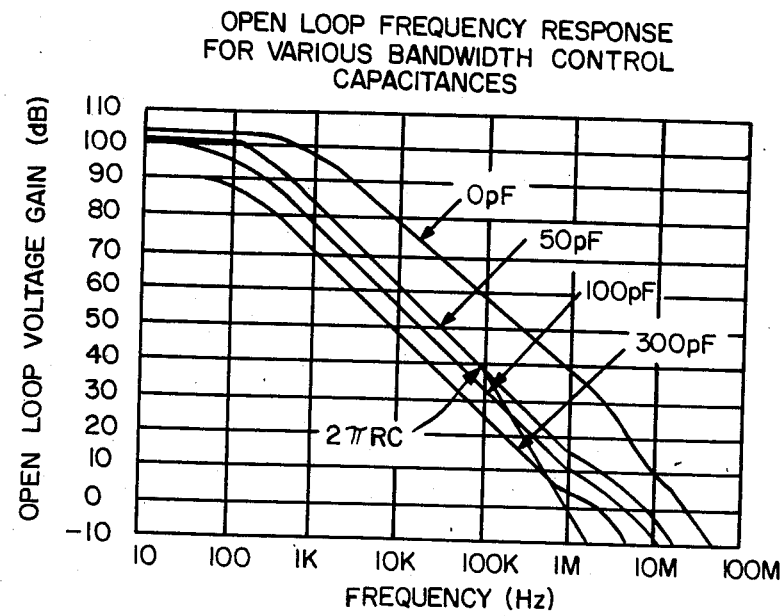
FIG. 7 is a graphical representation of the frequency response of the isolation amplifier.

The amplifier automaticallly accounts for variation in the MOSFETs gate threshold voltage and transfer characteristics. This results in a power stage which has linear response. The current output is directly proportional to the input command. with gain which depends only on frequency, and does not vary with output levels. The response of the power stage is limited by the HA-5160 wideband JFET input operational amplifier. The open loop frequency response for various bandwidth control capacitances is shown in FIG. 7. The gate capacitance of the MOSFET devices is offset by a 20,000 pf capacitor, which is in parallel with the input signal and also sets a high frequency corner with the amplifier output resistance at 100 Khz. The operational amplifiers are compensated with 50 pf. The MOSFET devices and sense resistors have a voltage gain which never exceeds unity in the range of operation, and is generally around −3 dB.

This results in a stable power stage with a unit gain crossover at 1 MHz, and a gain loss of 20 dB per decade below 100 Khz. The gain of the drive stage can be limited to less than the 100 dB provided by the operational amplifier to eliminate low frequency phase shift, which allows a higher frequency outer loop to be closed.

In addition to shaping the amplifier loop response, the external 20,000 pf gate capacitor dominates the internal capacitance of the MOSFET devices. This provides very low high frequency impedance, limited by the package inductances of the MOSFET and capacitor. This allows excellent rejection of the ripple on the drain-source voltage, and minimizes the impact of increasing capacitance when the drain-source voltage is low.

Thus, once the power stage operates with linear response, it becomes a much simpler matter to implement an isolation amplifier which is shown in FIG. 3. Isolation is provided by a transformer coupled carrier signal which is generated by the VMP4 MOSFET device. This carrier directly provides the plus and minus 15 volts for the gate drive amplifiers, and is modulated by the current command signal to generate to provide the positive and negative current commands. These positive and negative current commands are rectified and filtered on the secondary sides of the isolation transformers. A significant amount of carrier filtering is possible, as the power stage presents a relatively high impedance constant load.

The modulation of the carrier signal is accomplished by a MOSFET pair 60, 62 that are driven by an SE5534 low noise operational amplifier unit 64. Positive operational amplifier outputs allow current through the N channel 2N660 (MOSFET unit 60) to provide voltage signal on the positive current command. Negative operational amplifier outputs allow current through the P channel VP0808 (MOSFET unit 62) to provide a voltage signal on the negative current command.

The SE5534 amplifier unit 64 drives the modulator transistors (MOSFET units 60, 62) according to the current command signal that is received, and the voltage across a current sense resistor. The LM119 comparators, flip flops, and analog switches provide override for nonlinear operation.

Figure 8:
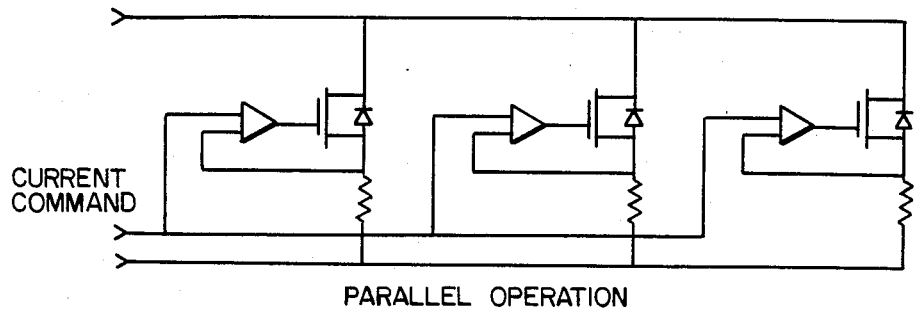
FIG. 8 is a schematic diagram of a amplifier power stage that is arranged for parallel operation.

The amplifier power stage is a complete component with a well behaved response. This makes it easy to adapt to parallel or series operation to increase the current or voltage limits. In FIG. 8 there is shown the parallel operation which is accomplished by connecting several power stages to the same command signal, with common drain and source connections. The current senses resistors in each power stage provides current sharing between the stages to insure operational accuracy.

Figure 9:
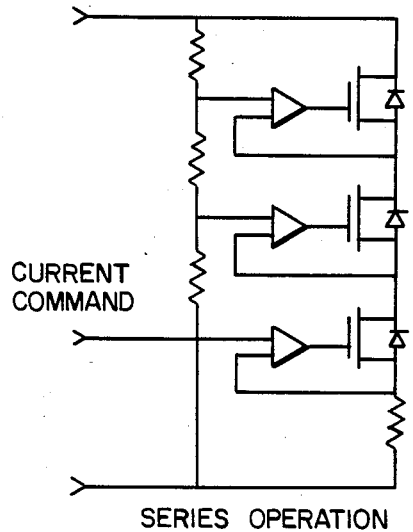
FIG. 9 is a schematic diagram of a amplifier power stage that is arranged for series operation.

Series operation may be accomplished with the circuit shown in FIG. 9. In this circuit configuration only the bottom power stage receives a current command signal. The upper stages are commanded by the RC network to share voltage equally with the bottom stage. The speed of the upper stages affects only voltage sharing and thus the power.

Figure 12:
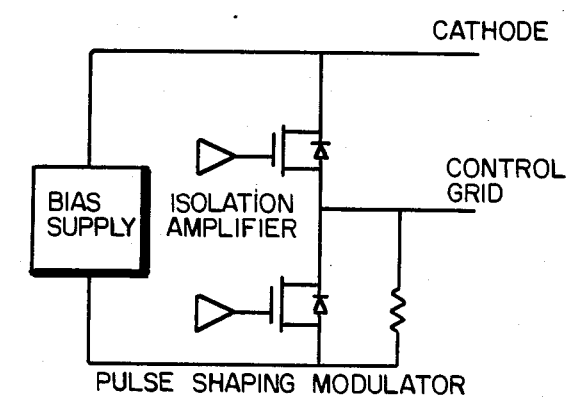
Figure 10:
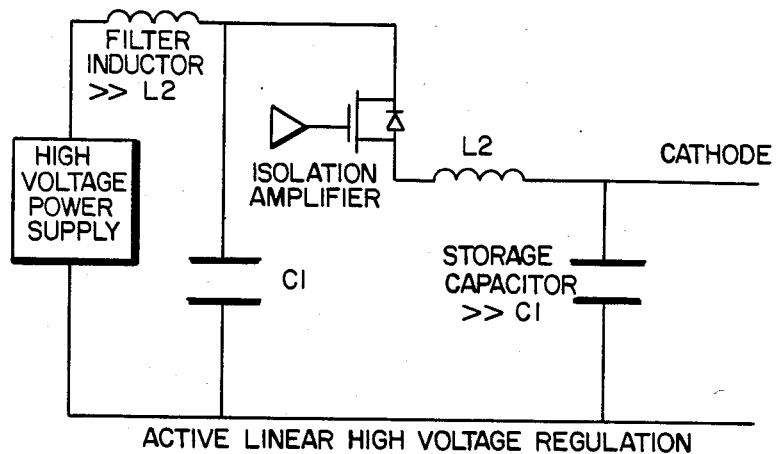
FIG. 10 is a schematic diagram of a drive circuit wherein the isolation amplifier provides active linear high voltage regulation.
Figure 11:
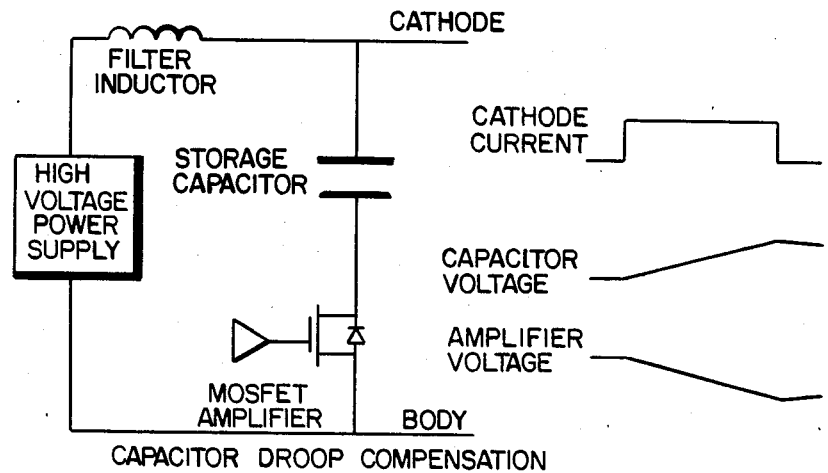
FIG. 11 is a schematic diagram of a drive circuit wherein the isolation amplifier provides capacitor droop compensation, and, FIG. 12 is a schematic diagram of a drive circuit wherein the isolation amplifier provides pulse shaping modulation.

The ability to build operational amplifiers capable of handling high currents at high voltages with good frequency response provides a means to linear regulation of high voltages (FIG. 10) would provide improved signal purity. A linear regulator in series with the cathode storage capacitor (FIG. 11) would allow a constant cathode voltage to be maintained for very long pulsewidths. Linear shaping of the control grid voltage (FIG. 12) would allow great versatility in the level of output RF power.

Although the invention has been described with reference to a particular embodiment, it will be understood to those skilled in the art that the invention is capable of a variety of alternative embodiments within the spirit and scope of the appended claims.

What is claimed is:

1. A high frequency, high voltage MOSFET isolation amplifier apparatus comprising in combination:

a current control amplifier to receive a current command signal at its non-inverting input, said current control amplifier providing a current signal;

a modulating means operatively connected to said current control amplifier to receive said current signal, said modulating means modulating said current signal at a predetermined frequency to provide a control signal, said modulation means including an isolation means, an operational amplifier means operatively connected to said modulating means to receive said control signal therefrom, said operational amplifier means providing a current control signal, said operational amplifier means floating with respect to ground, a plurality of power MOSFET devices operatively connected to said operational amplifier means to receive said current control signal, said power MOSFET devices connected between a plus and minus high voltage power supply, said power MOSFET devices providing a load current, an inductive load means operatively coupled to said power MOSFET devices to receive said load current, and, a feedback means connected between said inductive load means and ground, said feedback means providing a feedback signal, said feedback signal being applied to the inverting input of said current control amplifier.

2. A high frequency, high voltage MOSFET isolation amplifier apparatus as described in claim 1 wherein said isolation means comprises a transformer coupling means.

3. A high frequency, high voltage MOSFET isolation amplifier apparatus as described in claim 1 wherein said operational amplifier means comprises a low impedance drive means.

4. A high frequency, high voltage MOSFET isolation amplifier apparatus as described in claim 1 wherein said inductive load means comprises a magnetic yoke.

5. A high frequency, high voltage MOSFET isolation amplifier apparatus as described in claim 1 wherein said plurality of power MOSFET devices comprise two power MOSFETs in series.

6. A high frequency, high voltage MOSFET isolation amplifier apparatus as described in claim 1 said predetermined frequency comprises a 10 MHz clock signal.

* * * * *